(12) United States Patent
Melchior

(10) Patent No.: US 6,353,873 B1
(45) Date of Patent: Mar. 5, 2002

(54) APPARATUS AND METHOD TO DETERMINE A LONGEST PREFIX MATCH IN A CONTENT ADDRESSABLE MEMORY

(75) Inventor: Timothy A. Melchior, Colorado Springs, CO (US)

(73) Assignee: Aeroflex UTMC Microelectronic Systems, Inc., Colorado Springs, CO (US)

(*) Notice: Subject to any disclaimer, the term of this patent is extended or adjusted under 35 U.S.C. 154(b) by 0 days.

(21) Appl. No.: 09/243,041

(22) Filed: Feb. 2, 1999

Related U.S. Application Data

(63) Continuation-in-part of application No. 08/970,718, filed on Nov. 14, 1997, now Pat. No. 6,226,710.

(51) Int. Cl.[7] .............................................. G06F 12/00
(52) U.S. Cl. ........................................ 711/108; 365/49
(58) Field of Search .......................... 365/49; 711/108, 711/212, 221, 205–206; 707/3–6; 709/238–242; 370/355–357, 389, 392

(56) References Cited

U.S. PATENT DOCUMENTS

| | | | |
|---|---|---|---|
| 4,602,368 A | 7/1986 | Circello et al. ............. 714/718 |
| 4,758,982 A | 7/1988 | Price ........................ 711/108 |
| 4,758,983 A | 7/1988 | Berndt ....................... 365/49 |
| 5,053,951 A | 10/1991 | Nusinov et al. ............. 711/706 |
| 5,383,146 A | 1/1995 | Threewitt .................... 365/49 |
| 5,423,015 A | 6/1995 | Chung ........................ 711/108 |
| 5,530,958 A | 6/1996 | Agarwal et al. ................ 711/3 |
| 5,568,415 A | 10/1996 | McLellan et al. ............. 365/49 |
| 5,602,764 A | 2/1997 | Eskandari-Gharnin et al. .......................... 708/210 |
| 5,615,309 A | 3/1997 | Bezek et al. ................... 706/50 |
| 5,615,360 A | 3/1997 | Bezek et al. ................... 707/6 |
| 5,619,446 A | 4/1997 | Yoneda et al. ................ 365/49 |
| 5,640,534 A | 6/1997 | Liu et al. ..................... 711/146 |
| 5,706,224 A | 1/1998 | Srinivasan et al. ........... 365/49 |
| 5,752,260 A | 5/1998 | Liu ............................ 711/129 |
| 5,761,714 A | 6/1998 | Liu et al. .................... 711/127 |
| 5,787,458 A | 7/1998 | Miwa ......................... 711/108 |
| 5,796,974 A | 8/1998 | Goddard et al. ............. 712/211 |
| 5,806,083 A | 9/1998 | Edgar ........................ 711/108 |

Primary Examiner—Matthew Kim
Assistant Examiner—Denise Tran
(74) Attorney, Agent, or Firm—Morgan & Finnegan LLP

(57) ABSTRACT

A method and apparatus for determining the longest prefix match in a content addressable memory. A content addressable memory device comprises an application specific integrated circuit which interfaces between a general microprocessor and a random access memory so as to create an associative memory structure which includes transition nodes, significant nodes and arcs. A table including multiple data structures is created in the random access memory by the device for storing prefixes and associated data in a predetermined manner. The table is manipulated by the device in response to commands such as add data, delete data, and search for data by the microprocessor.

14 Claims, 26 Drawing Sheets

FIG. 19A (CONT.)

| PREFIX TABLE RECORDS (HEX) |
|---|
| RECORD 5: 2ECE2EEA00000004<br>0000000E448D159E |
| RECORD 3, WORD 1 MODIFIED TO:<br>2F5EBC0E01123456 |
| RECORD 6: 2ECE2E6A00000004<br>0000000E22468ACF |
| RECORD 3, WORD 0 MODIFIED TO:<br>2F5EBC0E01123456 |

ADDITION

PREFIX 12345678, SIGNIFICANCE VALUE = 29, GROUP = 7, ASSOCIATION = "WTST"

PREFIX 12345678, SIGNIFICANCE VALUE = 28, GROUP = 7, ASSOCIATION = "VTST"

APPARATUS AND METHOD TO DETERMINE A LONGEST PREFIX MATCH IN A CONTENT ADDRESSABLE MEMORY

CROSS-REFERENCE TO RELATED APPLICATIONS

This application is a continuation-in-part of U.S. application Ser. No. 08/970,718 filed Nov. 14, 1997, now U.S. Pat. No. 6,226,710 B1, entitled "Content Addressable Memory (CAM) Engine" which is herein incorporated by reference in its entirety.

BACKGROUND OF THE INVENTION

The present invention is generally directed to the storage, manipulation and retrieval of information from a memory. More particularly, the present invention is directed to a method and apparatus for locating the longest prefix match in a content addressable memory.

Content addressable memory (CAM) is a known type of associative memory which provides for retrieval of information based on partial knowledge of that information. An exemplary CAM controller is disclosed in pending U.S. application Ser. No. 08/970,718 filed Nov. 14, 1997, now U.S. Pat. No. 6,226,710 B1, entitled "Content Addressable Memory (CAM) Engine," referred to herein as the CAM-Engine, which is herein incorporated by reference in its entirety. In routing processors on networks, an important task is to determine a next destination address for a particular message. This task may be performed by using look up tables to match addresses to locations. If a match is found, the associated data is returned to the processor. Such lookup tables can be fairly large and thus a search using normal methods of storing data in a random access memory are time consuming. Usual methods are inefficient and unresponsive when managing large look up tables. Thus, there is a need in the art for improved methods for accessing information in content addressable memory.

SUMMARY OF THE INVENTION

An exemplary embodiment of the invention is a method and apparatus for determining the longest prefix match in a content addressable memory. A content addressable memory device comprises an application specific integrated circuit which interfaces between a general microprocessor and a random access memory so as to create an associative memory structure which includes transition nodes, significant nodes and arcs. A table including multiple data structures is created in the random access memory by the device for storing prefixes and associated data in a predetermined manner. The table is manipulated by the device in response to commands such as add data, delete data, and search for data by the microprocessor.

The above-discussed and other features and advantages of the present invention will be appreciated and understood by those skilled in the art from the following detailed description and drawings.

BRIEF DESCRIPTION OF THE DRAWINGS

Referring now to the drawings wherein like elements are numbered alike in the several FIGURES.

DETAILED DESCRIPTION OF THE INVENTION

Figure 1:
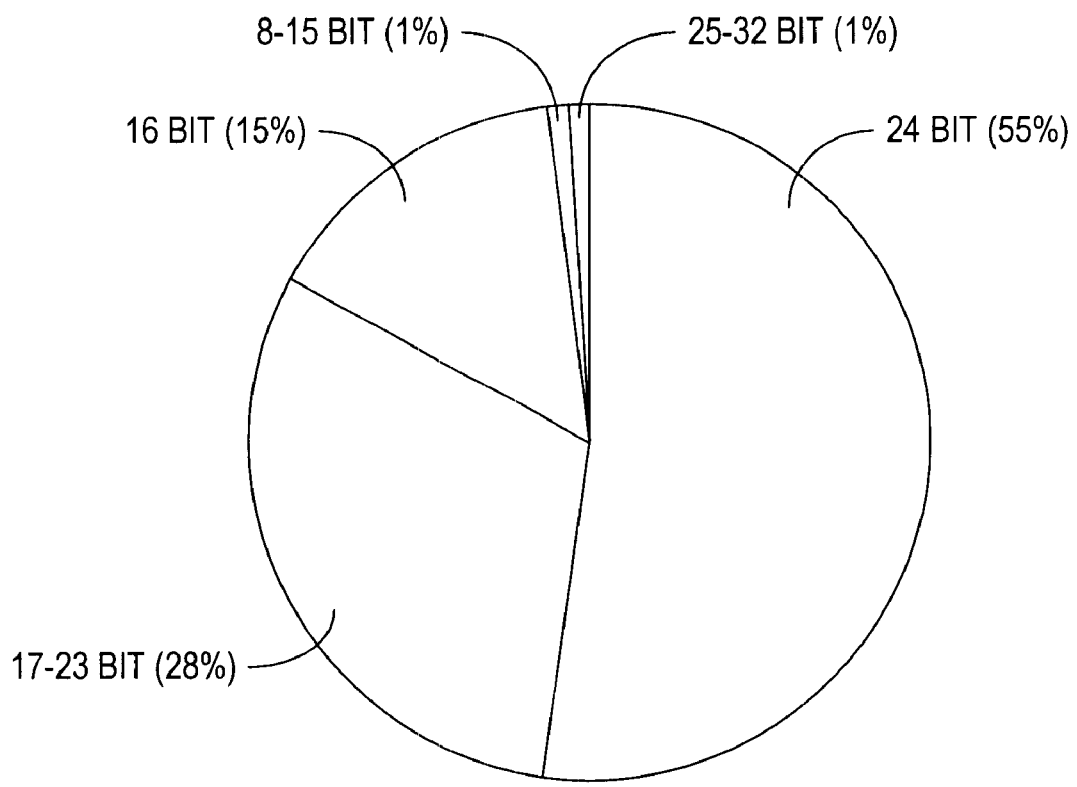
FIG. 1 illustrates a pie graph showing a typical prefix length distribution.

The present invention provides for accessing information by establishing a prefix table and locating the longest prefix in the table matching a query or seek prefix. Each prefix is uniquely defined by a prefix value, an associated significance value, and an optional group. The prefix value is a binary data element which varies in length from 1 to 32 bits. A prefix word is a 32 bit data element, the most significant bits (MSB) of which contains a prefix value. The significance value identifies the number of bits of the 32 bit prefix word that are significant, starting at the most significant bit (MSB). The remaining bits of the 32 bit prefix are not utilized. The group is an integer value from 0 to 127 which differentiates prefixes of different domains. Use of the group field is optional. The group field will be ignored if homogeneous prefixes are stored in a given table.

When a prefix is stored, four data items are presented to the CAM controller, namely the 32 bit prefix, the significance value, the group and 32 bits of associated data which is needed upon retrieval. The object of an access operation is to obtain the 32 bits of associated data.

To retrieve information, a prefix query including a 32 bit seek prefix and a group is presented. The data associated with the prefix which is in the designated group and matches the greatest number of significant bits is returned. All of the significant bits of a stored prefix must match the seek prefix in order for the stored prefix to be considered as a candidate. If no stored prefix within the designated group entirely matches the most significant bits of the presented 32 bit seek prefix, then a no-match status is returned.

Referring to Tables 1 & 2 below, an example of a longest prefix match is shown. The 32 bit prefix has been truncated for display purposes. The most significant bit is displayed in binary on the left. The decimal number following the slash indicates the number of significant bits represented by each prefix. The associated data column indicates the value to be retrieved.

TABLE 1

Examples of prefixes stored for comparison

| Group | Stored Prefixes | Associated Data |
|---|---|---|
| 0 | 001011011110/12 | Value A |
| 0 | 00101101/8 | Value B |
| 1 | 101011011110/12 | Value C |
| 1 | 001011/6 | Value D |

TABLE 2

Examples of matches performed against the stored prefixes

| Match Performed on | | Data Returned |
|---|---|---|
| 00101101111001001001100101101101 | group 0 | Value A |
| 00101101111001001001100101101101 | group 2 | no-match |
| 00101101011001001001100101101101 | group 0 | Value B |
| 10110110111000100100000011111111 | group 1 | no-match |
| 00101111111100010010001001111100 | group 1 | Value D |

Table 2 depicts the data returned upon generation of seek prefix and group data shown in the column labeled "match performed on." Note that the first match in Table 2 that is performed returns "Value A" even though it matches both of the first two stored prefixes in Table 1. This is because the "Value A" prefix is 12 bits long while the "Value B" prefix is only 8 bits long. Also, note that the second match results in a "no-match" condition because the group does not match. The fourth match results in a "no-match" condition because the fourth bit is different from the "Value C" prefix and no other prefix matches.

Referring to FIG. 1, a pie chart is shown depicting the distribution of prefix lengths in actual networks. Of special note is the high probability that matches will occur at 24 bits in length and the significant probability that they will occur at 16 bits. Prefixes of length 17 to 23 bits are distributed with increasing frequency toward the 23 bit length. There is a very low probability that a prefix will be longer than 24 bits or less than 16 bits. Prefixes less than 8 bits in length are virtually unused.

As described herein, the prefixes are arranged in prefix tables. Prefix tables are configured like other CAM-Engine tables except their key and association widths are fixed. Additionally, when a prefix table is configured, the user must specify if the table is group enabled or not and must specify the minimum significance length.

Like discrete CAM-Engine tables, prefix tables are configured to a depth from $2^9$ to $2^{26}$ records. In the case of prefix tables, this indicates the total node capacity at 100% packing density. Since some nodes are transition nodes, the total nodes stored may exceed the number of prefixes stored. Thus, an estimate of the number of transition nodes must be considered when sizing a table. The same packing density/performance relationship exists with prefix tables as with normal discrete CAM-Engine tables.

From a user perspective, the CAM-Engine set hierarchy, set context, delete table, unload table, count records, and load table commands operate exactly alike for either prefix tables or discrete tables. The add record, delete record, and seek distinct commands have slight differences which are described herein.

Figure 2:
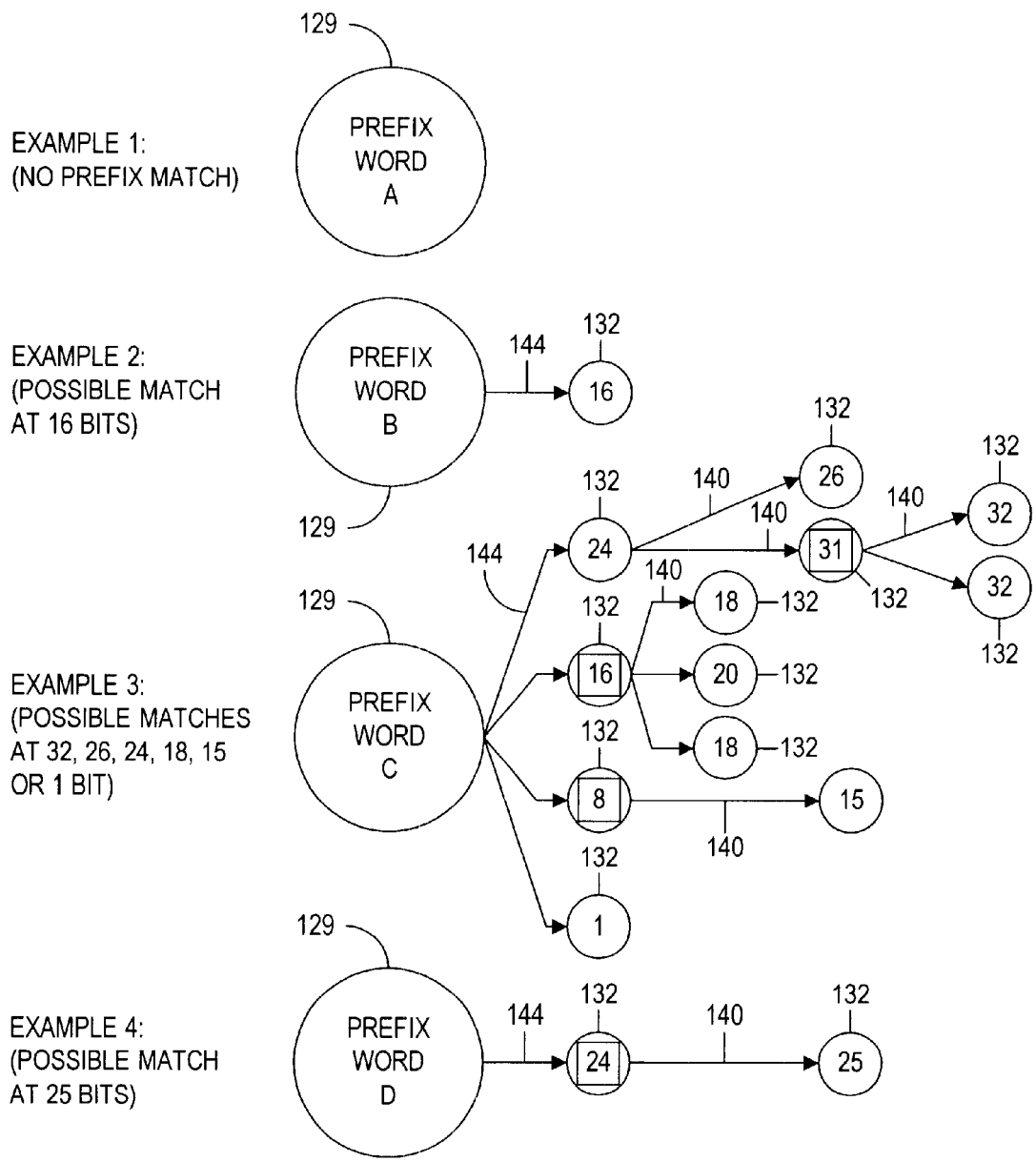
FIG. 2 illustrates an example of a digraph configuration.

Referring to FIG. 2, the high level data structure employed in this invention, a digraph, is shown. FIG. 2 represents a possible digraph configuration given a 4 element prefix word set. The base nodes 129 are shown as large shaded circles and represent 32 bit prefix words which can be interpreted at significance values of 24, 16, 8 and 1 through nodes 132. Nodes 24, 16, 8 and 1 are primary nodes and indicate starting points for traversing the prefix table. Other nodes 132 having different significance levels are secondary nodes. Arcs 144 are pointers from base nodes 129 to nodes 132. Depending upon the minimum significance length specified when a prefix table is configured, primary nodes 132 with significance values of 8 and 1 may not be allowed.

Nodes 132 that are non-shaded circles represent significant digraph nodes and the numbers within them represent their significance values. Shaded nodes 132 are transition nodes. Arcs 140 direct the search algorithm to subsequent nodes. The first level of arcs 140 are represented by the existence of either significant nodes or transition nodes. These nodes are stored in a prefix table and exact matches are performed to determine if these arcs exist.

The invention minimizes the average match time by first attempting a high probability 24 bit match on the most significant 24 bits of the prefix word. Extended matches beyond 24 bits are resolved and the data associated with the longest matching stored prefix is returned. If no stored prefix matches, the process is continued for 16 bits. If the prefix table is configured to allow stored prefixes less then 16 bits in length and no match is found greater than 15 bits, then the process is continued for 8 bits in length. If the table allows stored prefixes less than 8 bits in length and no stored prefix is found that is greater then 7 bits in length, then the process is continued one last time starting at one bit in length. If no stored prefix is found, then a no-match condition is returned.

Figure 3:
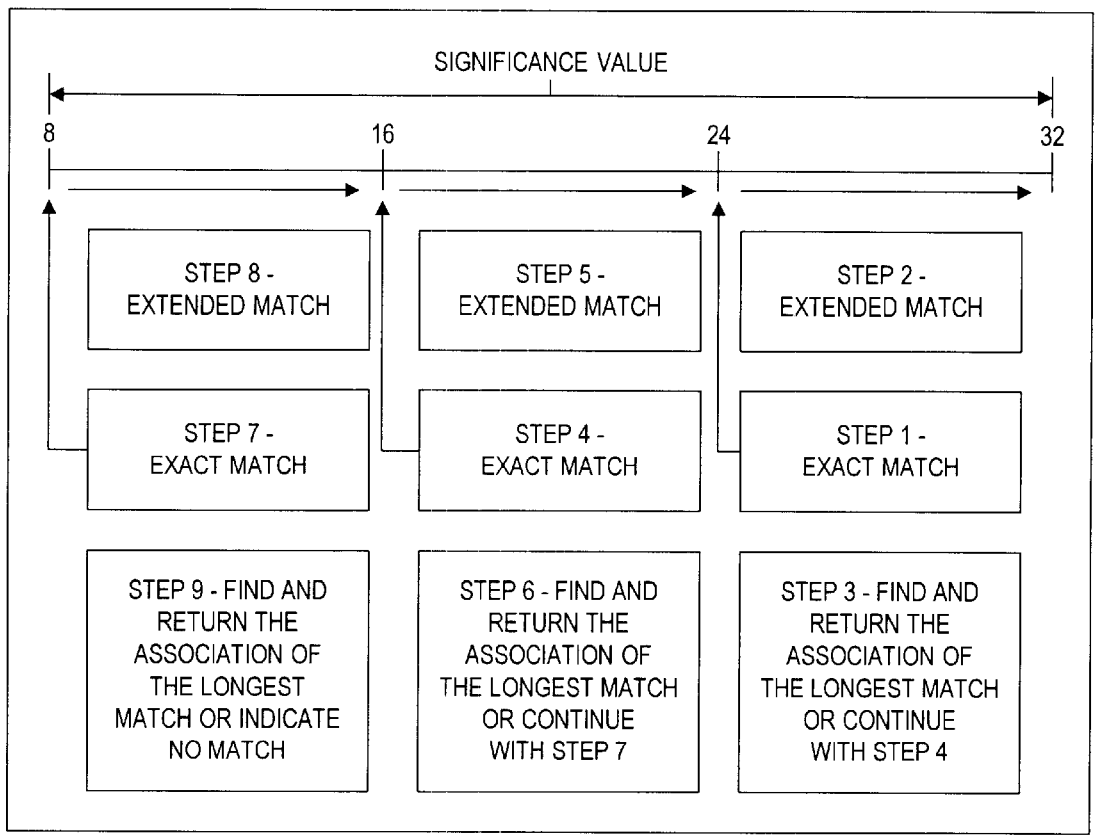
FIG. 3 illustrates a flowchart showing the longest prefix match steps.

FIG. 3 is a flowchart showing the process to determine if a longest prefix match exists. FIG. 3 illustrates this approach for a prefix table that is configured to allow prefixes as short as 8 bits. At step 1, the process determines if there is an exact match with a 24 bit prefix. If such a node exists, then step 2 processes arcs of the node to locate the longest prefix match. At step 3, the associated data or association of longest prefix match is returned. If no matches are located at the 24 bit or higher significance, then flow proceeds to step 4 where similar procedure is performed at the 16 bit significance. If no match is found at the 16–23 bit significance, flow proceeds to step 7 where similar processing is performed at the 8 bit significance.

The process represented by step 2 is unique. As described herein, the range of an arc 140 is limited to 7 bits, and thus a significance length of 32 can not be reached from a node 132 with 24 bits of significance using a single arc 140. To accommodate this, nodes 132 with 31 bits of significance can act as transition nodes. If such a node 132 is encountered when performing step 2, any stored 32 bit prefixes are examined to determine if a 32 bit prefix match exists.

Figure 4:
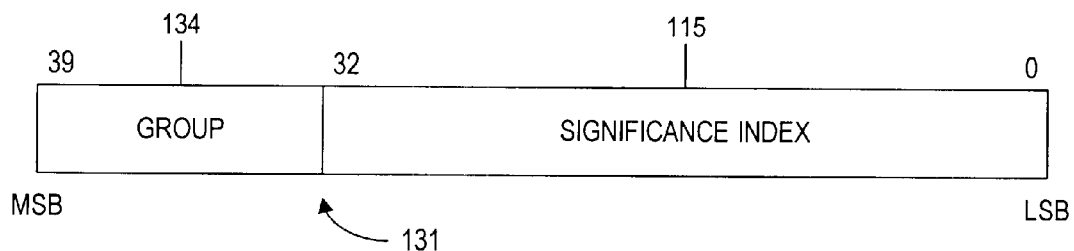
FIG. 4 illustrates a data structure showing a 40 bit node key.

Referring now to FIG. 4, a record is shown illustrating the field structure of a 40 bit node key 131. Each node 132 stored in a prefix table is indexed by a 40 bit node key 131 including a 7 bit group field 134 and a 33 bit significance index 115. The significance index 115 is constructed by right justifying the significant prefix bits into a 33 bit field leaving the left most bits padded with zeros. The right most bit in this field of padded zeros is set to 1. Thus, the number of significant bits contained in the significance index 115 can be determined by the location of the most significant 1 bit.

Referring to Table 3 shown below, several examples of significance indexes 115 constructed from prefix words and significance values are shown. The significant bits are bold.

TABLE 3

Examples of Significance Index Construction

| Prefix Word (binary) | Significance Value | Significance Index (binary) |
|---|---|---|
| 00101101111001001001100101101101 | 16 decimal | 00000000000000010010110111100100 |
| 0010110101100100100100100101101101 | 31 decimal | 01001011010110010010010010110110 |
| 00101101011001001001001001011011010 | 32 decimal | 10010110101100100100100100101101101 |
| 101101101111000100100000011111111 | 9 decimal | 0000000000000000000000001101101101 |

Viewing each example in Table 3 in a row by row fashion, one can see how the significance index 115 (column 3) of each prefix word (column 1) is constructed. In row 1 for example, the left most 16 bits, shown in bold are transposed into the right most 16 bits of the significance index 115 in the 3$^{rd}$ column of the 1$^{st}$ row. Of the remaining bits in the significance index field, the right most bit is set to '1', and the remaining bits are set to '0'. Similarly, the significance indexes 115 for rows 2 & 3 are constructed.

An arc 140 is a one way pointer from one node 132 to another node 132. The destination node must have a greater significance index 115 than the source node. All of the significant bits of the source node must also be the most significant bits of the destination node. For example, assume that the two prefixes below exist:

TABLE 4

Example Prefixes

| Prefix Word (binary) | Significance Value |
|---|---|
| 00101101111001001001100101101101 | 16 decimal |
| 00101101111001001001100101101101 | 19 decimal |

Figure 5:
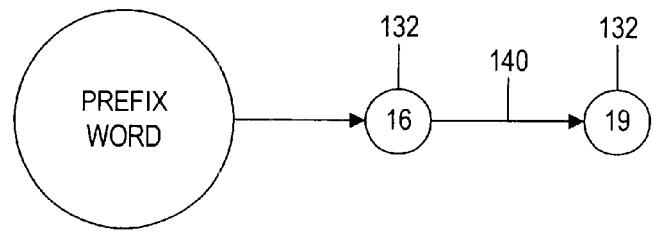
FIG. 5 illustrates a digraph of Table 4.

Referring now to FIG. 5, a digraph is shown. In this example, the two prefixes (column 1 of Table 4) can be represented by a digraph in which a node 132 with a significance value of 19 is referenced by an arc 140 which is anchored on a node 132 with a significance value of 16. In this example, the arc 140 represented by the solid line between the node 132 with 16 significant bits and the node 132 with 19 significant bits is encoded to indicate that a node 132 exists which shares the most significant 16 bits. Note additionally that the node 132 referenced by the arc 140 has three additional bits of significance—specifically, 100 binary.

An arc 140 can have a range from 1 to 7 bits. For example, an arc 140 anchored on a node at a 16 bit significance value can direct a search to a node with a significance of 17 to 23 bits. Arcs 140 contain information about their range and the significant bits they represent. Arcs 140 are encoded in two manners, low and medium density arcs or high density arcs.

Low and medium density arc encoding is similar to significance indexes. The encoded arc is constructed by right justifying the significant bits they represent in 8 bits, leaving the left most bits padded with zeros. The right most bit in this field of padded zeros is set to 1. Thus, the number of significant bits contained in a low or medium density arc can be determined by the location of the most significant 1 bit. Table 5 below shows several examples of low or medium density arcs constructed from a specific number of significant bits. The significant bits are bold.

TABLE 5

Examples of Arc Construction

| Significant Bits (binary) | Arc Range | Arc |
|---|---|---|
| 1001 | 4 decimal | 00011001 |
| 0 | 1 decimal | 00000010 |
| 0010110 | 7 decimal | 10010110 |

Having density arc encoding utilizes a 256 bit bit-map in which the bits are indexed by the arc value derived in low and medium density structures. This allows all possible arcs 140, from a given node 132, to be represented in a single compact storage structure.

Each node 132 is stored as a 128 bit (two 64 bit words) record in a prefix table. Nodes with high density arcs require an additional 256 bit linked memory block. The structure of the node record is dynamic, depending upon the stored prefixes at any point in time. Each record contains a node type field which identifies the node as being either a significant node or a transition node. Additionally, the node type identifies how arcs to subsequent nodes are stored. Depending upon the number of arcs, low, medium, or high density storage structures will be used to encode them. Table 6 below shows the six valid values for the node type and the corresponding prefix conditions.

TABLE 6

Node Types

| Node Type | Condition Indicated by Node Type |
|---|---|
| 1 | Transition node with low density arcs |
| 2 | Transition node with medium density arcs |
| 3 | Transition node with high density arcs |

TABLE 6-continued

Node Types

| Node Type | Condition Indicated by Node Type |
|---|---|
| 4 | Significant node with no arcs |
| 5 | Significant node with Low density arcs |
| 7 | Significant node with high density arcs |

Figure 6:
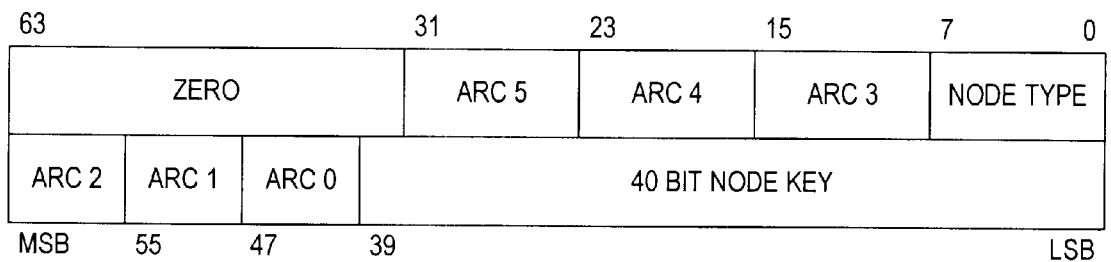
FIG. 6 illustrates the record structure of a transition node with low density arcs.

Each node type will be described with reference to FIGS. 6–17. Referring to FIG. 6, a record structure illustrating a transition node with low density arcs is shown. The record structure shows the data storage structure for a transition node with low density arcs (node type=1). This storage structure comprises two 64 bit words. The word with the lower address is shown on top.

Figure 7:
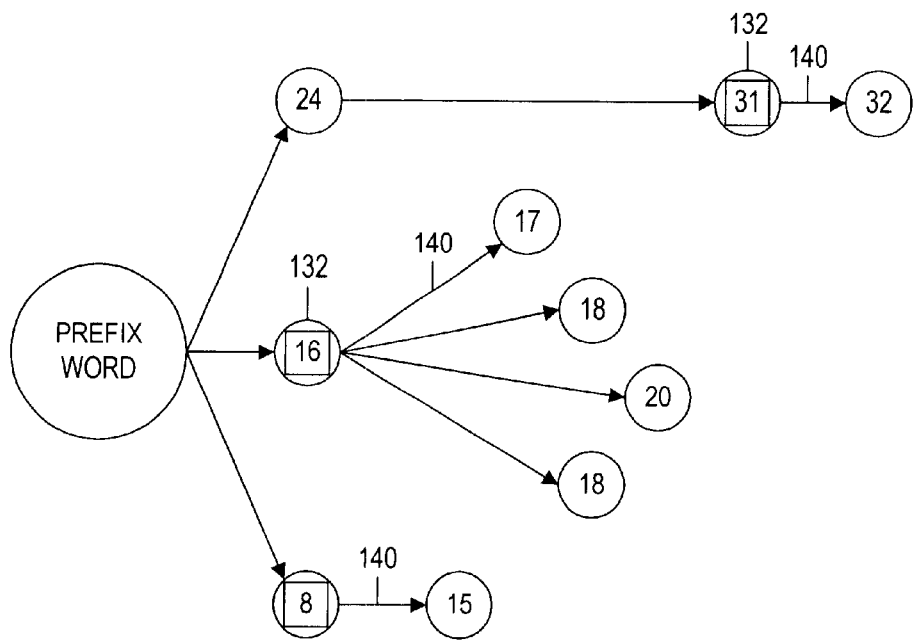
FIG. 7 illustrates a digraph showing three transition nodes with low density arcs.

A transition node does not itself represent a stored prefix. It exists as a stepping stone for other nodes which share its level of significance and have 7 or less bits of additional significance. This record type can support up to 6 arcs 140 which are shown as Arc0–Arc5. Referring to FIG. 7, a digraph illustrating 3 transition nodes with low density arcs 140 is shown. The nodes 132 having significance levels of 8, 16, and 31 do not identify significant prefixes. They are examples of transition nodes with low density arcs. Note that the node 132 with a significance level of 31 is a special case. The node 132 with a significance level of 32 can not be reached from the level 24 node because it is more than the maximum arc range (7 bits) from the level 24 node. To accommodate this, an insignificant transition node 132 at a significance level of 31 is inserted.

Referring now to Table 7 below, prefix words and their significance values are shown. Table 7 is an example of a set of prefixes which could result in the digraph shown in FIG. 7.

TABLE 7

Example Prefixes Resulting in Transition Nodes with Low Density Arcs

| Prefix Word (binary) | Significance Value |
|---|---|
| 11101001011010010101000100000101 | 24 decimal |
| 11101001011010010101000111011001 | 32 decimal |
| 00101101111001001001000101101100 | 17 decimal |
| 00101101111001001001101101010101 | 18 decimal |
| 00101101111001000101110110101101 | 18 decimal |
| 00101101111001000000100011101100 | 20 decimal |
| 11100100100011110001011111000010 | 15 decimal |

Figure 8:
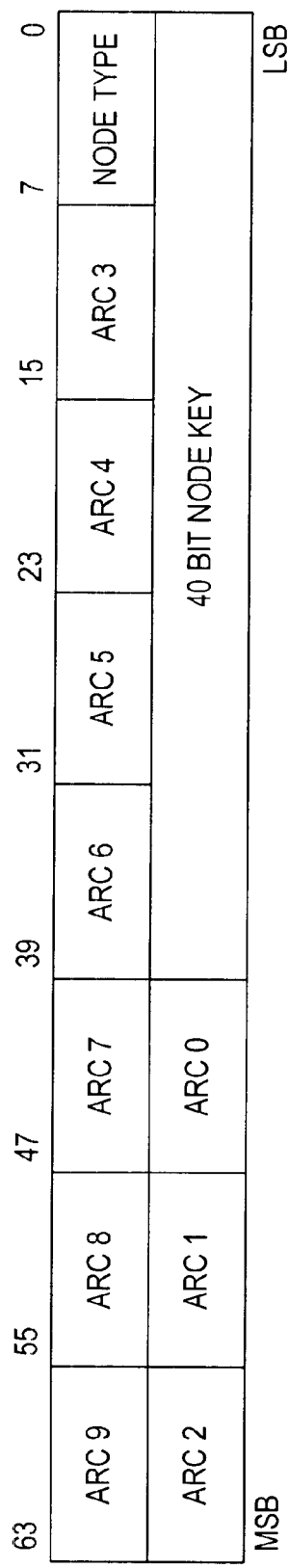
FIG. 8 illustrates the record structure of a transition node with medium density arcs.

Referring now to FIG. 8, a record structure illustrating a transition node with medium density arcs and a node key is shown (node type=2). The 64 bit word with the lower address is shown on top. Like node type 1, this type of node does not itself represent a stored prefix. It exists as a stepping stone for other nodes which share its level of significance and have 7 or less bits of additional significance. This record type can support up to ten arcs shown as Arc0–Arc9.

Figure 9:
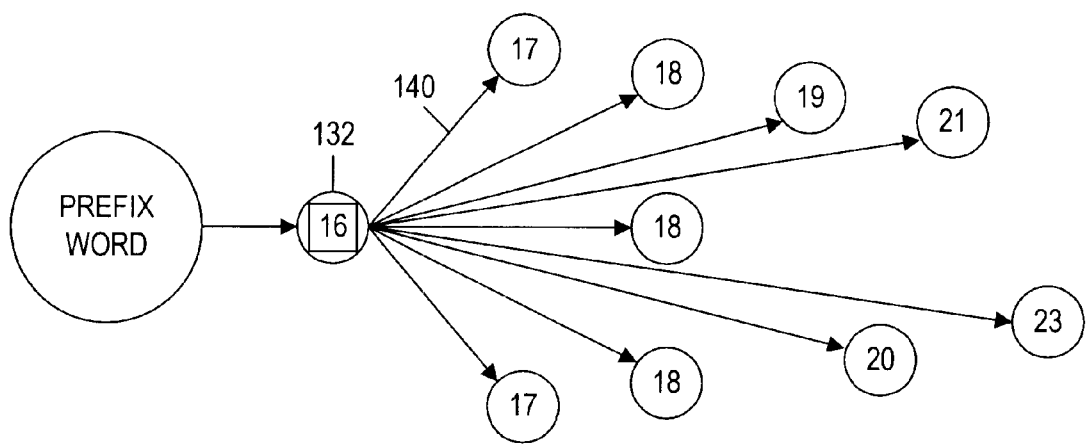
FIG. 9 illustrates a digraph showing a transition node with medium density arcs.

Referring now to FIG. 9, a digraph illustrating a transition node 132 with multiple dependent medium density arcs 140 is shown. The transition node 132 having a significance level of 16 bits does not have a stored prefix but exists only to indicate the existence of, and provide an arc 140 linking to each of the nine significant nodes shown.

Referring now to Table 8 below, a set of prefixes and their significance values which would result in the FIG. 9 digraph construction is shown.

TABLE 8

Example Prefixes Resulting in Transition Nodes with Medium Density Arcs

| Prefix Word (binary) | Significance Value |
|---|---|
| 11101001011010010101000100000101 | 17 decimal |
| 11101001011010011110100011101100 | 17 decimal |
| 11101001011010011101000111011001 | 18 decimal |
| 11101001011010011001000100011001 | 18 decimal |
| 11101001011010010000000000000000 | 18 decimal |
| 11101001011010010011011111011001 | 19 decimal |
| 11101001011010011000100010001100 | 20 decimal |
| 11101001011010010000000101011001 | 21 decimal |
| 11101001011010011111111101000111 | 23 decimal |

Figure 10:
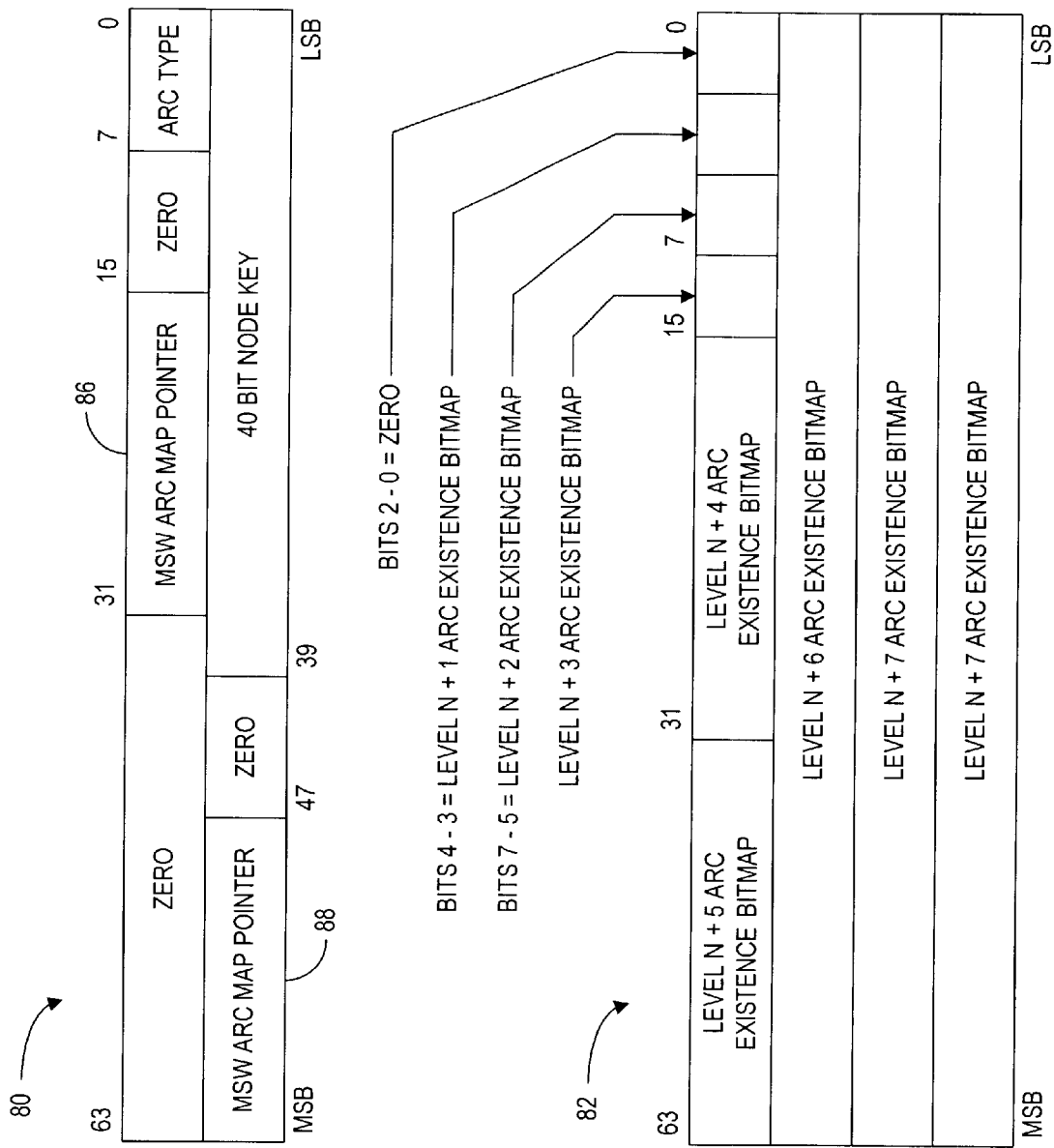
FIG. 10 illustrates the record structure of a transition node with high density arcs.

Referring now to FIG. 10, a storage structure illustrating a transition node with high density arcs is shown. This is node type=3. The storage structure consists of two distinct memory segments. The first is a 2 word node record 80. The second is a four word arc map 82. Two fields in the node record 80 contain a pointer to the arc map 82. The most significant bits of the 32 bit arc map pointer are contained in the MSW (Most Significant Word) Arc Map Pointer field 86 while the least significant bits (LSB) of the 32 bit arc map pointer are contained in the LSW (Least Significant Word) Arc Map Pointer field 88. The 64 bit words with the lower addresses are shown on top.

Like node types 1 and 2, this type of node (type 3) does not itself represent a stored prefix. It exists as a stepping stone for other nodes which share its level of significance and have seven or less bits of additional significance. This record type can support up to two-hundred fifty-four (254) arcs 140.

Figure 11:
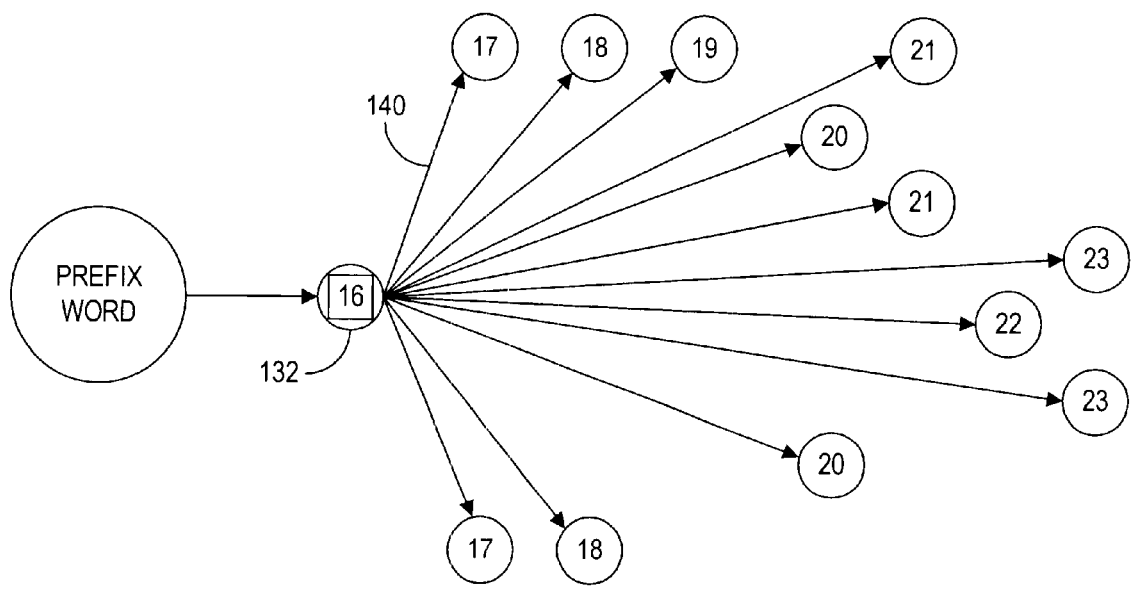
FIG. 11 illustrates a digraph showing a transition node with high density arcs.

Referring now to FIG. 11, a digraph illustrating a transition node 132 with high density arcs 140 is shown. The transition node 132 having a significance level of 16 does not identify a significant prefix, as in all transition nodes, but exists only to indicate the existence of the twelve (12) significant nodes shown.

Referring now to Table 9 below, a set of prefixes 100 and their significance values 102 which would result in the FIG. 11 digraph construction is shown.

TABLE 9

Example Prefixes Resulting in Transition Nodes with High Density Arcs

| Prefix Word (binary) | Significance Value |
|---|---|
| 11101001011010010101000100000101 | 17 decimal |
| 11101001011010011110100011101100 | 17 decimal |
| 11101001011010011101000111011001 | 18 decimal |
| 11101001011010011001000100011001 | 18 decimal |
| 11101001011010010011011111011001 | 19 decimal |
| 11101001011010011000100010001100 | 20 decimal |
| 11101001011010010011000000000000 | 20 decimal |
| 11101001011010010000000101011001 | 21 decimal |
| 11101001011010010000100000000000 | 21 decimal |
| 11101001011100100100000000000000 | 22 decimal |
| 11101001011010010000000100000000 | 23 decimal |
| 11101001011010011111111101000111 | 23 decimal |

Figure 12:
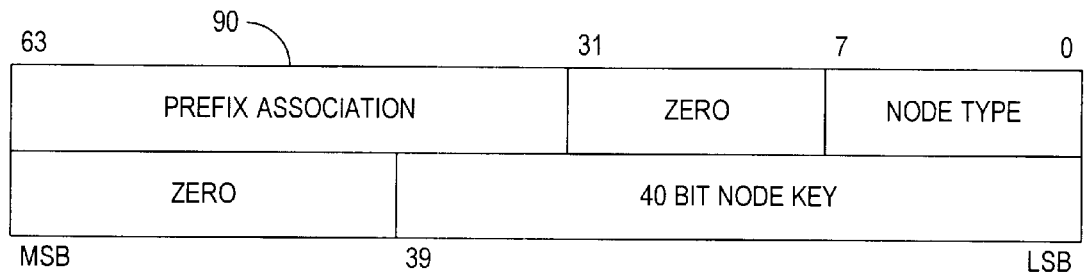
FIG. 12 illustrates the record structure of a significant node without arcs.

Referring now to FIG. 12, a storage structure illustrating a significant node which does not anchor any arcs 140 (node type=4) is shown. This storage structure comprises two 64 bit words. The word with the lower address is shown on top. This type of significant node (node type=4) is common and is used to store all terminal nodes (e.g. nodes not anchoring any arcs). This node contains a stored 32 bit prefix association 90 which is the data provided upon matching with this node.

Figure 13:
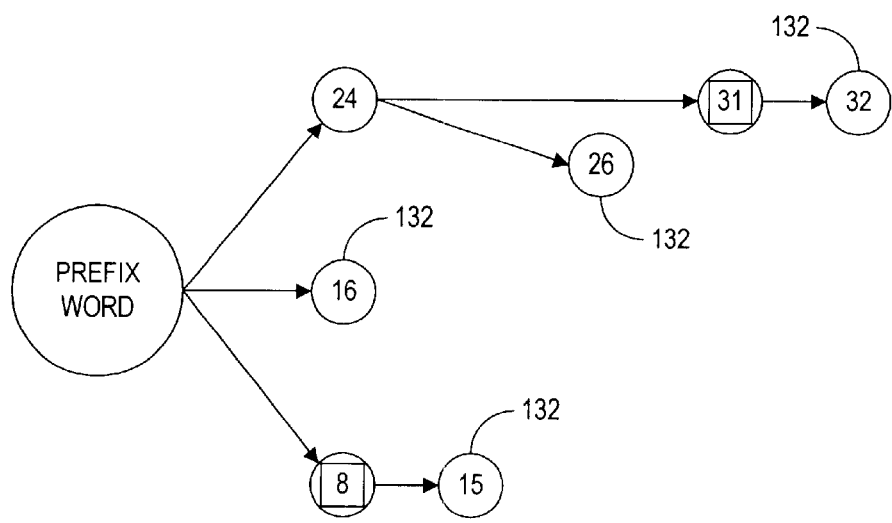
FIG. 13 illustrates a digraph showing two transition nodes with low density arcs.

Referring now to FIG. 13, a digraph illustrating several significant nodes 132 without any arcs 140 is shown. The significant nodes 132 with significance levels of 15, 16, 26, and 32 are all terminal nodes, that is, they are all significant nodes without arcs 140.

Figure 14:
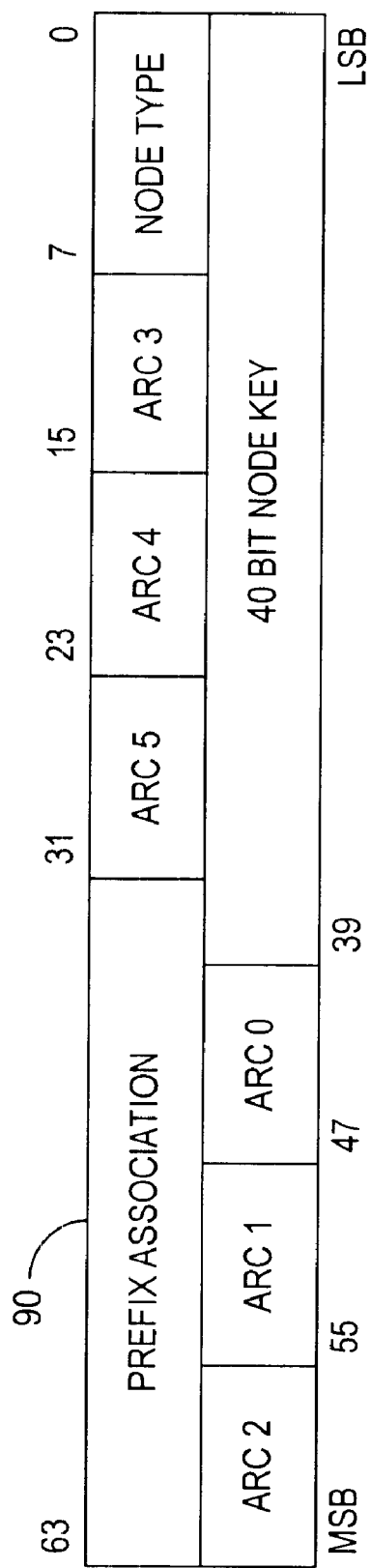
FIG. 14 illustrates the record structure of a significant node with low density arcs.

Referring now to FIG. 14, a storage structure illustrating a significant node with low density arcs (node type=5) is shown. This storage structure comprises two 64 bit words. The word with the lower address is shown on top. This type of node is the same as a transition node with low density arcs except that the node itself represents a stored prefix 90. Thus, this node carries the association of the prefix which it represents.

Figure 15:
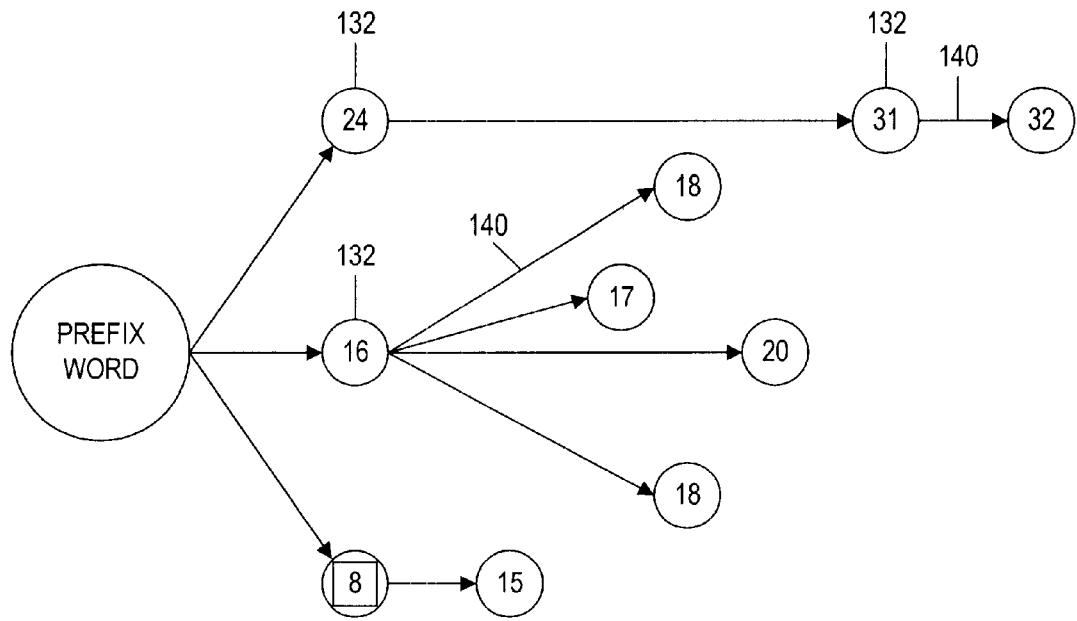
FIG. 15 illustrates a digraph showing three significant nodes with low density arcs.

Referring now to FIG. 15, a digraph illustrating significant nodes 132 having low density arcs 140 is shown. The shaded node (the node at significance level 8) is a transition node with low density arcs. The nodes at significance levels 16, 24, and 31 are significant nodes 132 with low density arcs 140.

Figure 16:
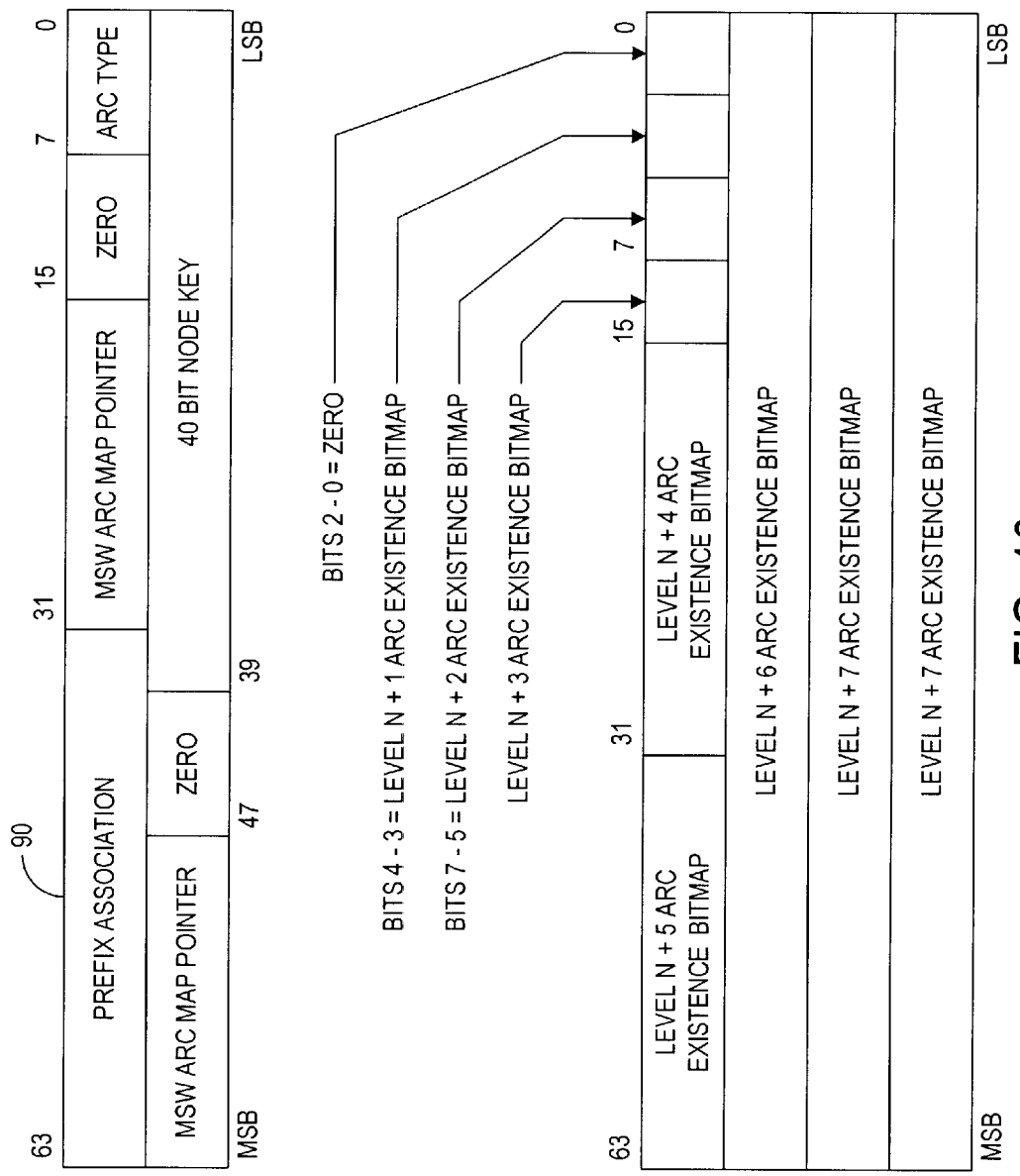
FIG. 16 illustrates the record structure of a significant node with high density arcs.

Referring now to FIG. 16, a storage structure illustrating a significant node having high density arcs (node type=7) is shown. This storage structure is identical to transition nodes having high density arcs, except it carries the association 90 of the prefix represented by the node. This node type, like a transition node having high density arcs, can support up to two-hundred fifty-four (254) arcs. The difference between a record type 3 and a record type 7 is that the node itself represents a stored prefix 90.

Figure 17:
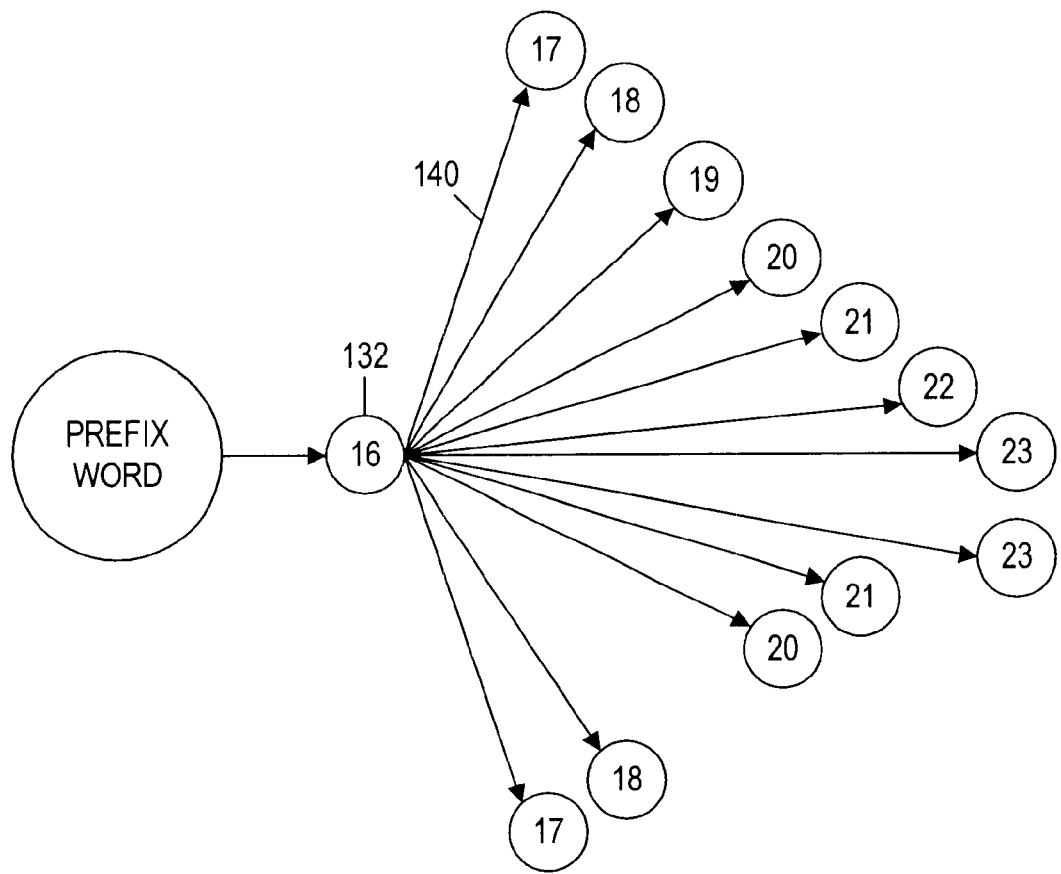
FIG. 17 illustrates a digraph showing a transition node with high density arcs.

Referring now to FIG. 17, a digraph illustrating a significant node 132 having high density arcs 140 is shown. The node 132 having a significance level of 16 exists because it is significant (has its own stored prefix 90) and it serves to indicate the existence of 12 other significant nodes. It should be noted that a high density arc may point to any node type (1 through 7), i.e., a significant node or a transition node.

Figure 18:
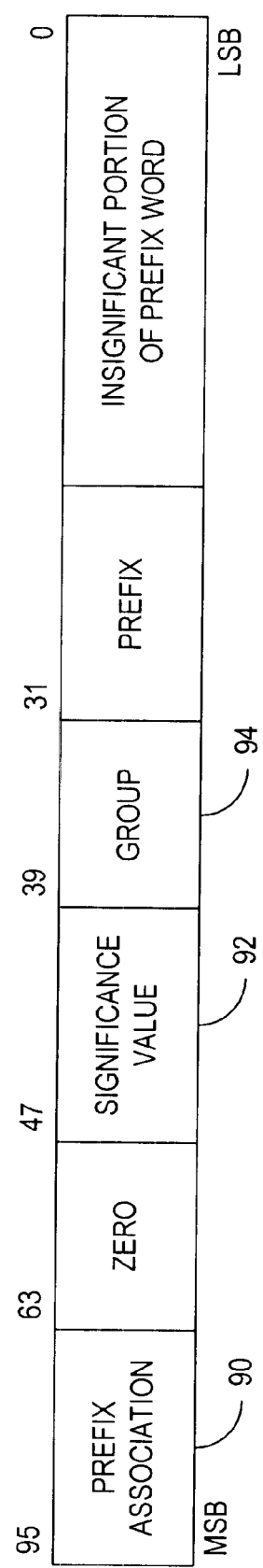
FIG. 18 illustrates the record structure of a prefix to be added to a prefix table.

The process of adding or deleting prefixes to the prefix table will now be described. Referring now to FIG. 18, a record structure illustrating the data fields for adding a prefix to a prefix table are shown. To add a prefix to a prefix table, the data shown in FIG. 18 must be provided to the CAM engine. Bits 63–48 are left zero to align the prefix association 90 on a 32 bit boundary. To delete a prefix in a group enabled table, only bits 39–0 need to be provided. To delete a prefix in a table that is not group enabled, only bits 31–0 need to be provided.

The significance value field 92 contains the significance value of the prefix being added or deleted. It indicates the number of bits in the prefix word (bits 31–0) portion which are significant. The prefix is contained in the high order bits of the prefix word. Any insignificant low order bits of the prefix word are ignored.

Valid values for the group field 94 range from zero to one-hundred twenty-seven (127). This field effectively allows a prefix table to be segmented into as many as one-hundred twenty-eight (128) different logical tables. When prefixes are maintained for multiple domains, this may provide better memory management than configuring multiple prefix tables and reduces the need to change table context.

Several fundamental data items may be constructed in parallel. The greatest element of the set {1,8,16,or 24}, which is less than or equal to the significance value of the prefix being added or deleted, is identified. This number, {1, 8, 16 or 24}, the group, and the significant prefix data, is used to create the primary node key. The secondary node key is created from the group, all of the significant prefix bits and the length (significance value) provided. An arc 140 is constructed from any significant bits that exceed the significance value of the primary significance index.

Thus, after a single clock cycle, the primary node key is available to start the update process. This process fundamentally consists of the adding, deleting and modifying the nodes 132 and arcs 140 contained in the prefix table. Internally, the prefix data is stored in a normal CAM-Engine table. Discrete node maintenance is performed by internal calls to the discrete table record seek, addition, and deletion routines. The tables are treated as an embedded record type with 5 bytes of key and 11 bytes of association.

Figure 19:
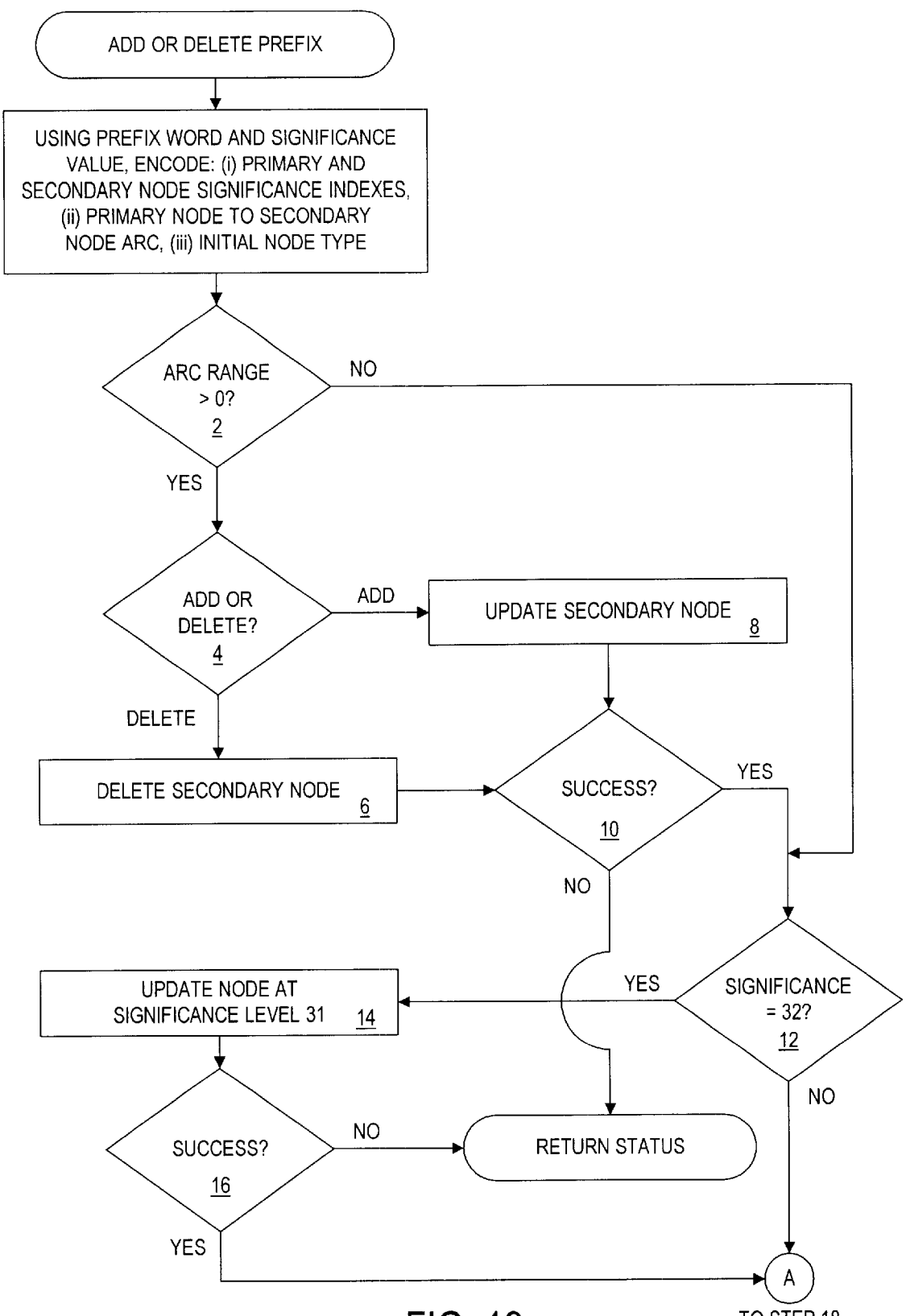
FIG. 19 illustrates a flowchart showing the add and delete prefix steps.
Figure 19:
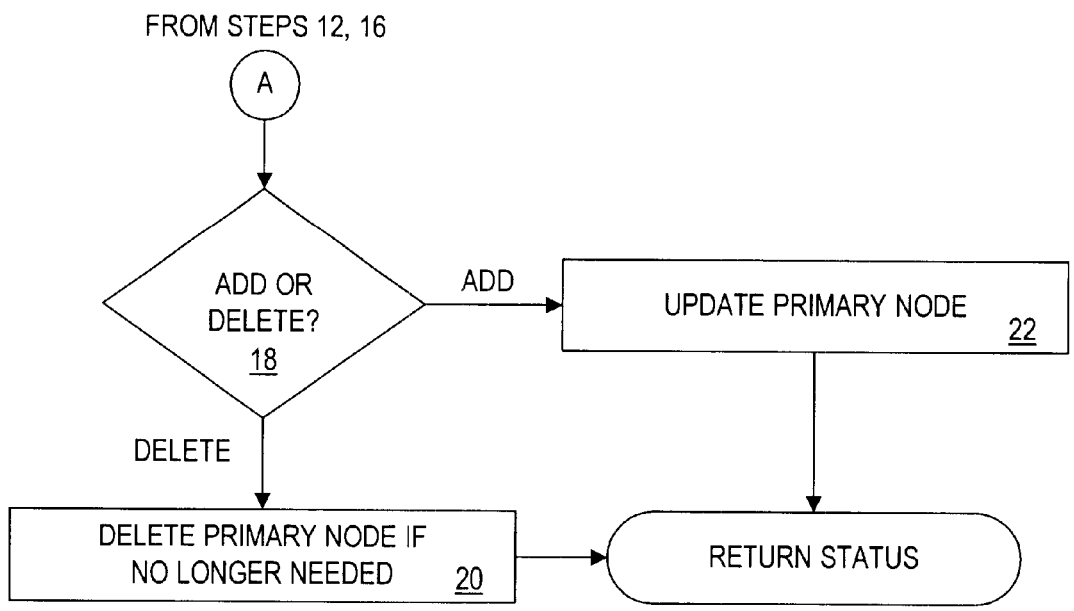

Referring now to FIG. 19, a flowchart illustrating the process for adding or deleting a prefix from the prefix table is shown. As indicated, the process uses the prefix word and significance value to encode primary and secondary node significant indexes, primary node to secondary node arcs and initial nodes. At step 2, it is determined whether the arc range for the node of interest is greater than zero. If the arc length is greater than zero, flow proceeds to steps 4–8 where a secondary node is added or deleted accordingly. Steps 6 and 8 lead to step 10 where the success of the updating or deleting is confirmed. Step 10 or a negative indication at step 2 leads to step 12 where it is determined if the significance is 32. As noted above, a node with a significance of 32 is a special case since it cannot be reached from primary node having a significance of 24. If the node has a significance of 32, then flow proceeds to step 14 where a node at significance level 31 is updated and the success is confirmed at step 16. If at step 12, the significance is not 32, then flow proceeds to steps 18–22 where a primary node is updated or deleted accordingly.

Figure 19A:
FIG. 19A depicts additions to a prefix table.

Referring now to FIG. 19A, an example of several prefix additions and the corresponding prefix table updates are shown. The left hand portion of FIG. 19A graphically illustrates the prefix table and the right hand portion indicates the contents of records in the prefix table. The first addition, a significant node is stored with 32 bits of significance and two transition nodes are added with significance values of 31 and 24. Next, a significant node is added with a significance value of 31. Since the transition node represented by record 2 already exists, a single modification to make it significant and store its association is all that is required. The remaining additions involve adding the new significant nodes, which all share the most significant 24 bits represented by record 3. In each case, a new arc is added to record 3.

Figure 25:
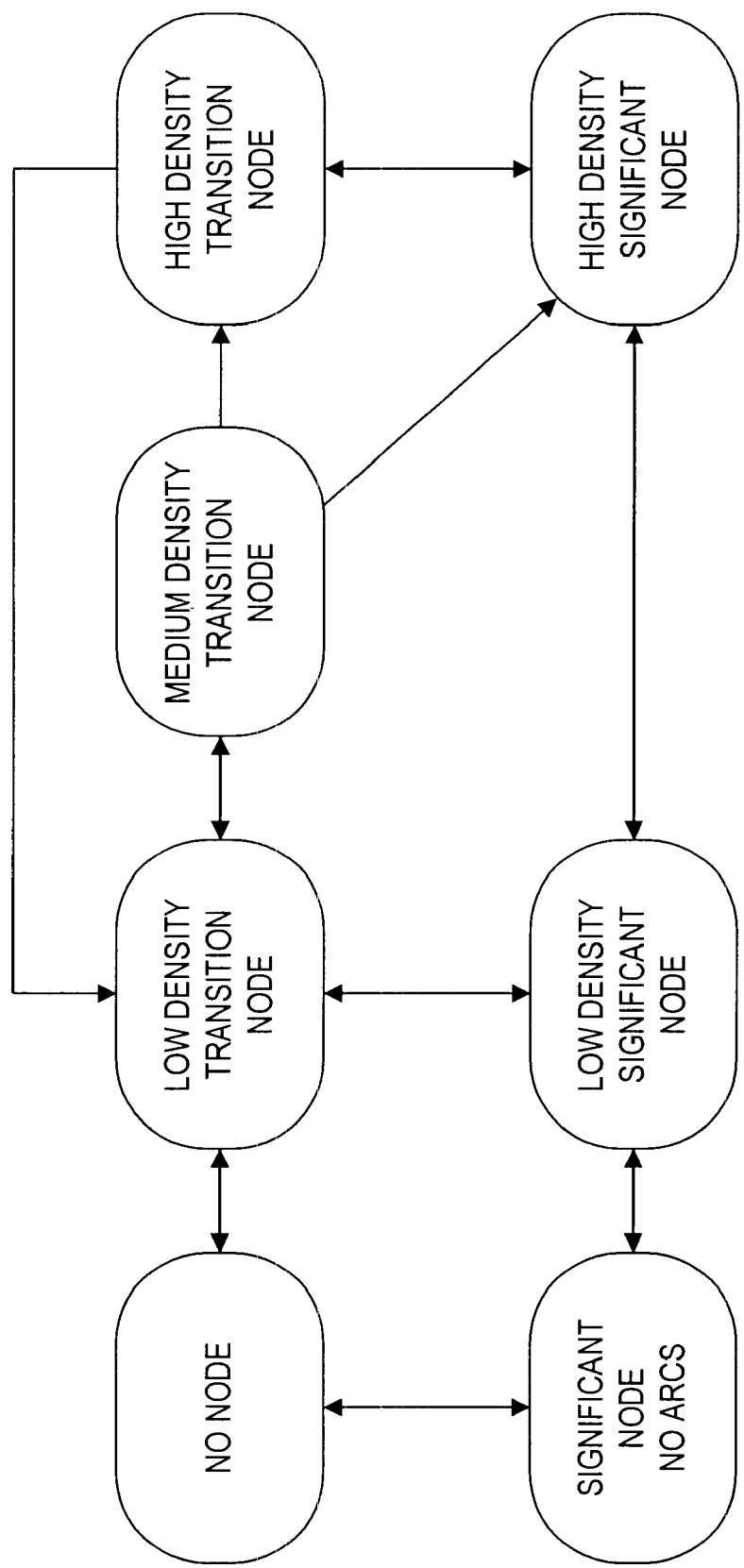
FIG. 25 illustrates a state diagram showing the allowable nodes and their valid transitions.

FIG. 25 is a state diagram illustrating the allowable node states and their allowable change paths. Each of the allowable change paths is due to the addition or deletion of a single prefix as described above.

Figure 20:
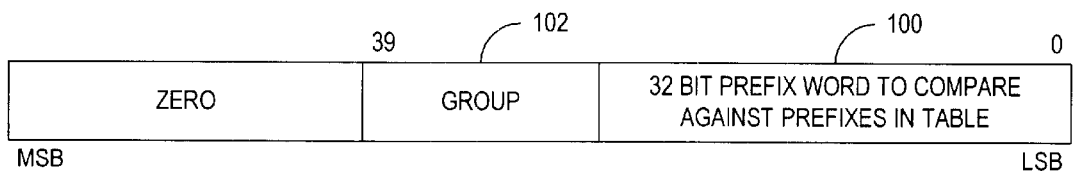
FIG. 20 illustrates the record structure of a prefix to be searched for in a prefix table.

Referring now to FIG. 20, a storage structure illustrating data fields used to seek the longest prefix in a prefix table is shown. The data fields used to locate the longest matching prefix in the prefix table are a 32 bit seek prefix 100 and a group field 102. When the microprocessor issues a seek command to the CAM engine, the seek prefix data shown in FIG. 20 is also provided to the CAM engine. When the prefix table is not group enabled, only a 32 bit seek prefix word 100 is presented as the key. If the table is group enabled, the group data 102 must also be passed as part of the key as shown in FIG. 20.

Figure 21:
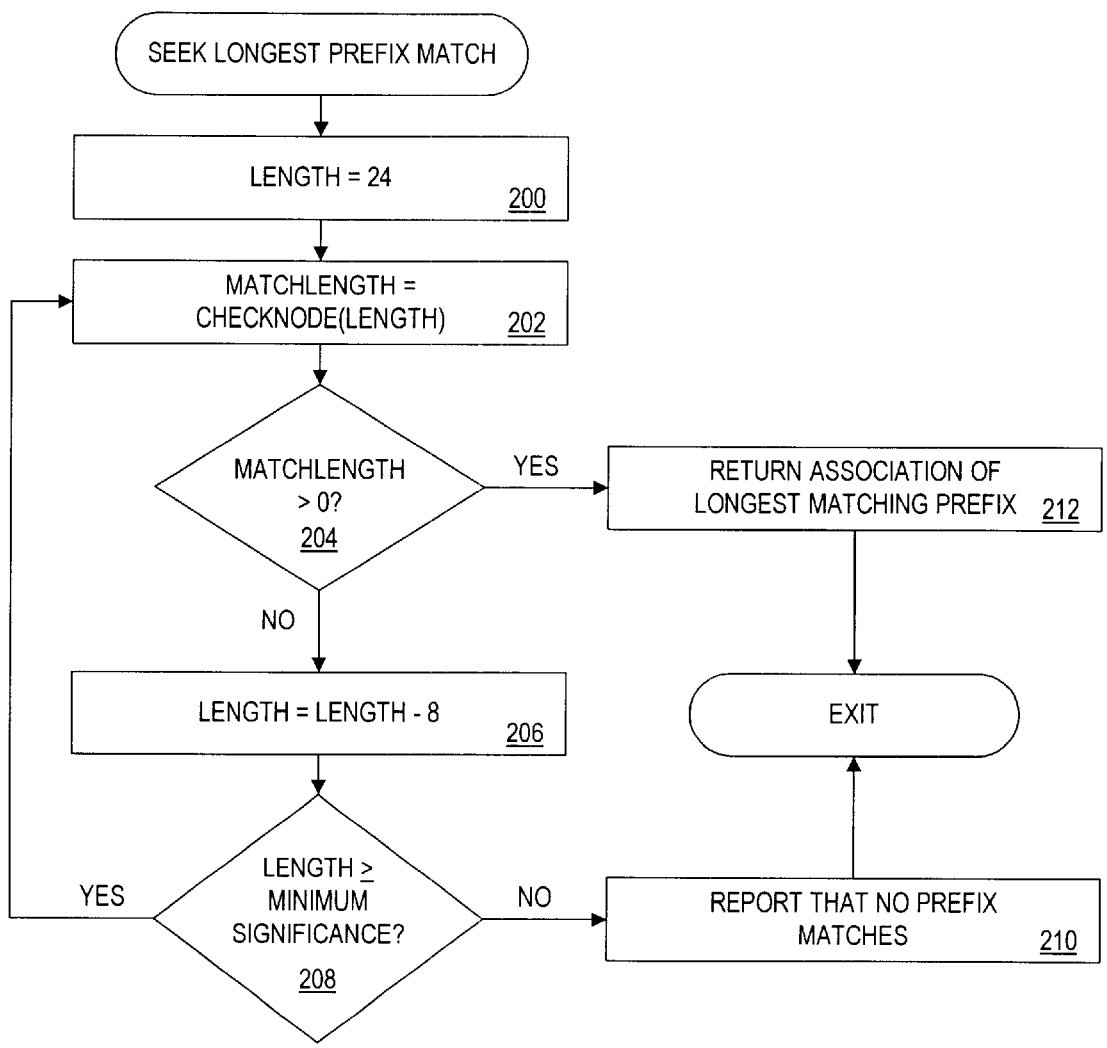
FIG. 21 illustrates a flowchart showing the seek longest prefix match steps.

Referring now to FIG. 21, a flowchart illustrating the seek longest prefix match process is shown. The process begins at step 200 where variable length is set to 24. As noted above, the process begins searching the prefix table at a significance length of 24 bits. At step 202, variable matchLength is set equal to the result of a CheckNode routine described below with reference to FIG. 22. At step 204, it is determined if matchLength is greater than zero. If not, this indicates that no matches were found in the CheckNode routine at a significance level of 24 and higher. At step 206, the length variable is reduced by 8. In this way, the process examines primary nodes in the order of 24, 16, 8 and 1. If at step 208, the length variable is less than or equal to a minimum significance (e.g. some prefix tables do not go below 8 bit significance) then flow proceeds to step 210 where the process indicates that no matches were found and the process ends.

At step 204, if the matchLength value returned by the CheckNode routine is greater than zero, this indicates that a match was found. At step 212, the process returns the association (associated data) for the longest matching prefix and the process ends.

Figure 22:
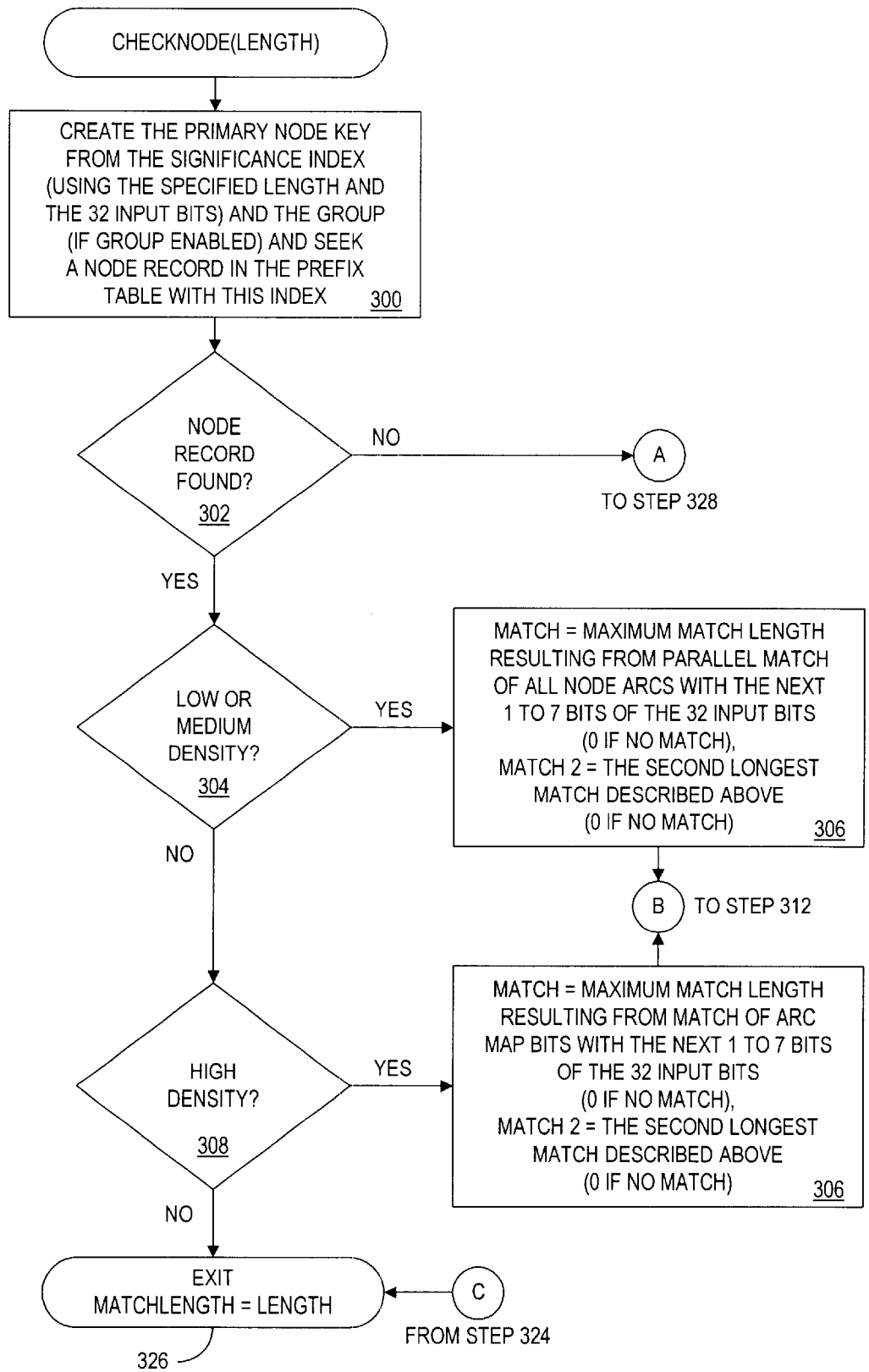
FIG. 22 illustrates a flowchart showing the check node steps.
Figure 22:
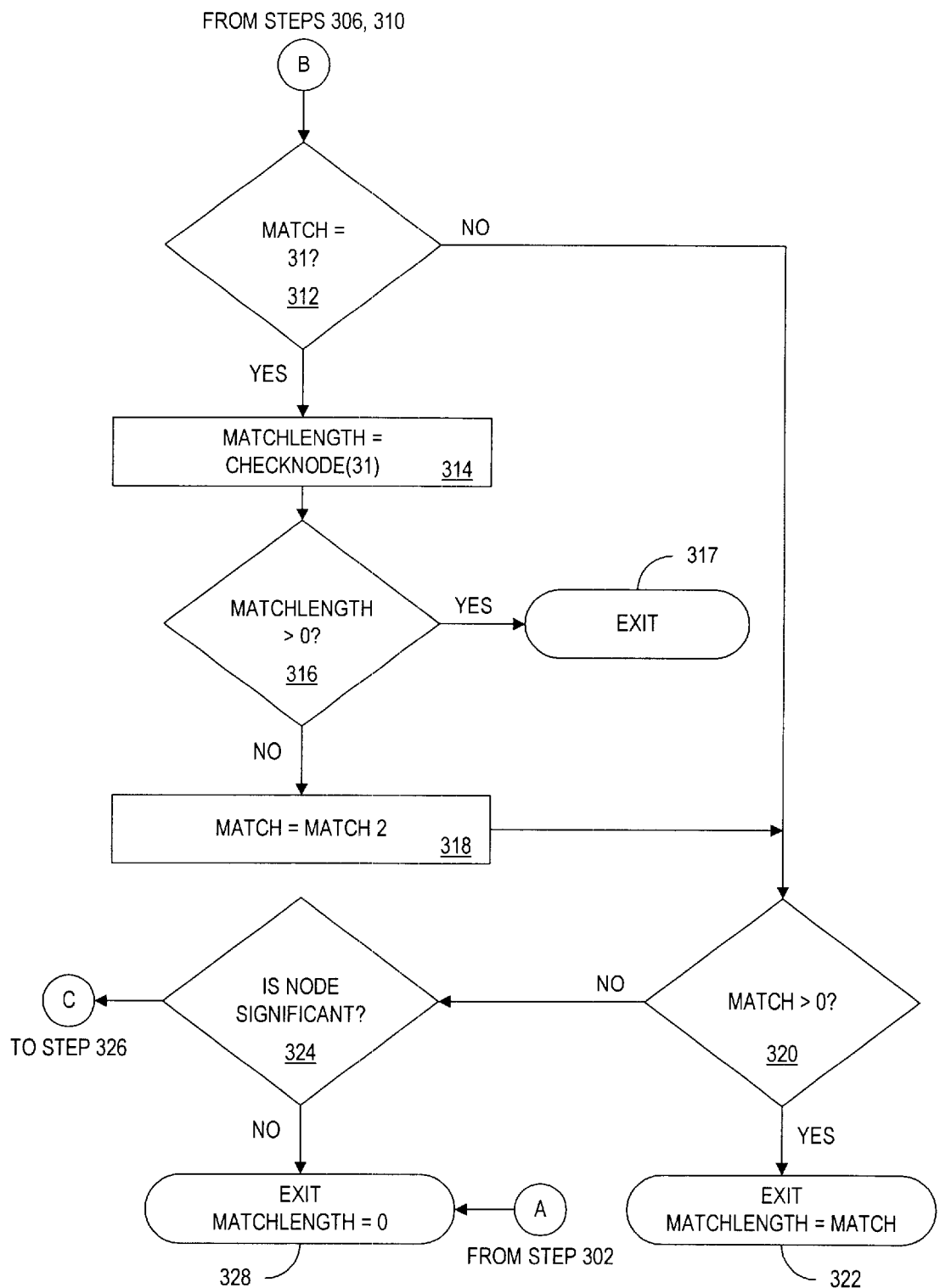

Referring now to FIG. 22, a flowchart illustrating the CheckNode process is shown. The process begins at step 300 where a primary node key is generated based on the prefix word in the seek prefix and the length variable. As described above with reference to FIG. 21, the length variable is cycled through the primary node significance values of 24, 16, 8 and 1. At step 300, the process searches for a primary node in the prefix tree having the node key (e.g. having the appropriate number of bits matching the seek prefix and in the specified group if group enabled). If at step 302, it is determined that no primary node is found, flow proceeds to step 328 where CheckNode ends and returns a matchLength of zero.

If at step 302, a primary node is found, flow proceeds to step 304 where it is determined if the primary node includes low or medium density arcs. If so, flow proceeds to step 306 where the variable match is set to the maximum match length resulting from an attempt to match to all nodes defined by all node arcs. The matching to nodes defined by node arcs is performed in parallel. The variable match is set to zero if no match is found. A second variable match 2 is set equal to the second longest match or zero if there is no match.

Figure 23:
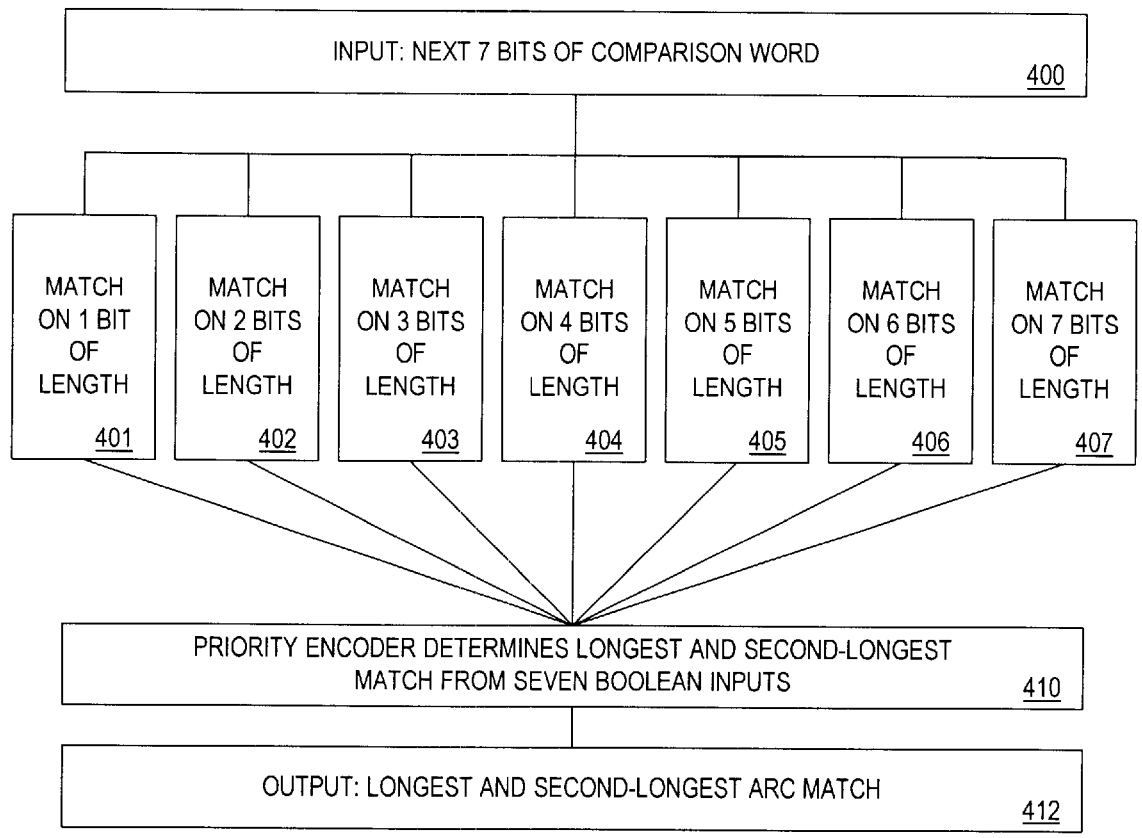
FIG. 23 is a block diagram of a device for processing low density arcs in parallel.

As described below with reference to FIGS. 23 and 24, the invention may be embodied in silicon implementations (e.g. an ASIC) which provides the ability to perform the parallel processing of node arcs. The parallel comparisons can be performed in combinatorial logic and a priority encoder can select the longest and second longest matches.

At step 304, if no low or medium density arcs are found, then flow proceeds to step 308 where the process determines the existence of high density arcs. If no high density arc exists, flow proceeds to step 326 where CheckNode ends and the matchLength variable is set to the variable length. If high density arcs exist, flow proceeds to step 310 where the variable match is set to the maximum match length resulting from an attempt to match to all nodes defined by all node arcs. The variable match is set to zero if no match is found. A second variable match2 is set equal to the second longest match found or zero if there is no match.

Steps 306 and 310 lead to step 312 where it is determined if a match was found for a node having a significance of 31. If a node is found that has a significance length of 31 bits, then a recursive call must be made to the CheckNode process at step 314 to determine if the node having the 31 bit significance is a transition node for a significant 32-bit prefix or if the node at 31 bits is itself a significant node. As indicated in steps 316–318, if the node record matching 31 bits of significance is a transition node and the 32-bit prefix which it anchors does not match all 32 bits of the prefix word, then the second longest matching arc is used to identify longest matching prefix node.

Step 312 and 318 lead to step 320 where it is determined if the variable match has been assigned a value greater than zero. If so, this means that a node linked to the initial primary node was located and the variable matchLength is set equal to the variable match representing the located maximum match length. If at step 320, it is determined that match equals zero, flow proceeds to step 324. If match equals zero, this indicates that the only matching node was located at step 302. At step 324, it is determined if this node is significant (references associated data) or is a transition node. If the matching node is significant, flow proceeds to step 326 where matchLength is set to the variable length.

Enhanced performance is achieved when the longest match prefix process is embodied in a custom silicon device such as an ASIC. This allows the match comparison, referenced above in FIG. 22, to be performed in parallel in a single clock cycle. Referring now to FIGS. 23 & 24, the parallel logic used to perform these matches is shown. Referring first to FIG. 23, the logic architecture for performing a low/medium density arc match is shown. At input 400 (e.g. a buffer), the next seven bits of the comparison word (e.g. seek prefix) are input. A plurality of comparators 401–407 search the prefix table for a match using a specific number of additional bits. The specific number of bits represent arc range. For example, if the length of the primary node key is 24, comparator 401 determines the existence in the prefix table of a node having a significance of 25 matching the 25 most significant bits of seek prefix. When the match is performed against a low or medium density node, then each of the seven parallel match processes creates an 8 bit low density arc structure from the input word bits and the length being compared. Each process compares the newly created arc against all possible storage locations in the node record. Each comparator 401–407 generates a boolean match value indicating whether a match was located. For example, a comparator may generate a boolean 1 if a match is found. A priority encoder 410 receives the boolean match values generated by the comparators 401–407 and determines the longest and second longest matching prefixes identified in FIG. 22. Output 412 (e.g. buffer) provides the longest and second longest arc matches. These values are then used to access the data associated with longest and second longest arc matches as shown in step 212 of FIG. 21.

Figure 24:
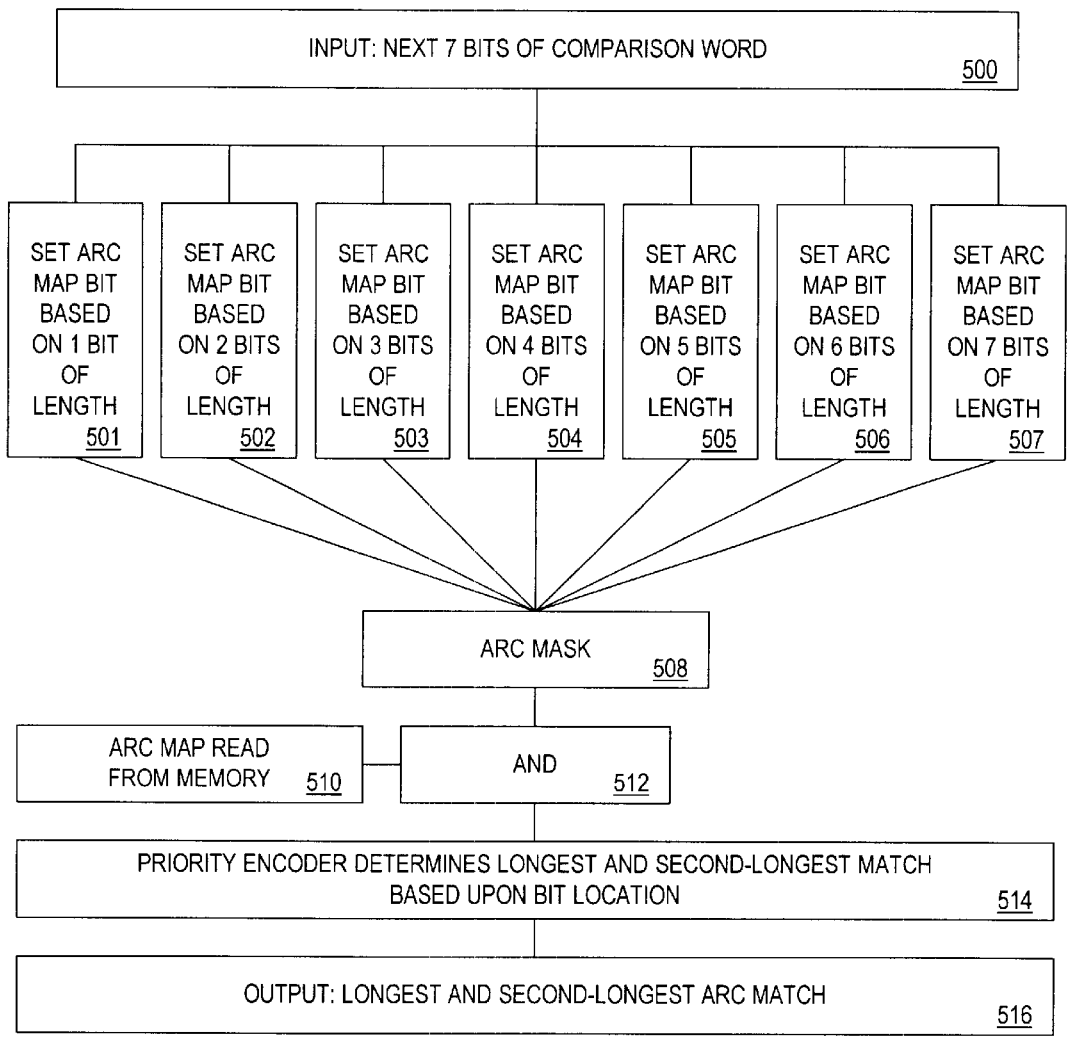
FIG. 24 is a block diagram of a device for processing high density arcs in parallel.

Referring now to FIG. 24, the logic architecture for performing a high density arc match is shown. Input 500 (e.g. a buffer) receives the next 7 bits of the comparison word (e.g. seek prefix) and provides these seven bits to seven comparators 501–507. The comparators 501–507 operate in a similar fashion to comparators 401–407. Each comparator 501–507 generates a boolean arc map bit based on 1 to 7 additional bits of length, respectively. The boolean arc map bits from comparators 501–507 are stored in an arc mask which may be any type of memory such as a register. An arc map is read from memory and stored in memory 510 (e.g. a register) and the contents of register 508 and 510 are bitwise ANDed at AND logic 512. The result of the AND logic 512 is provided to a priority encoder 514 which determines the longest and second longest matching prefixes identified in FIG. 22. Output 516 (e.g. buffer) provides the longest and second longest matches. These values are then used to access the data associated with longest and second longest arc matches as shown in step 212 of FIG. 21.

A number of design objectives have been considered in the development of the invention. While the invention must be optimized for match speed, it still must provide a reasonable response time for additions and deletions to the table. Reasonable is considered to be about two times the match time. This precludes most methods which would requiring the balancing of trees or major reconstruction of the prefix data when an add or delete is performed. The invention should be optimized for the frequency distribution of prefix lengths in current network applications. As shown above in FIG. 1, the most frequently occurring prefix length is 24 bits.

While average match time is important, worst case match time must still be reasonable. Ideally, the worst case should be kept to under 500 Ns with an average match time around 200 Ns. In addition, the logic complexity of the method must be manageable. The logic should result in less then 40K additional gates to existing CAM-Engines. In addition, the capabilities of existing CAM-Engines should be utilized as much as possible the invention should be easily incorporated within exiting CAM-Engine architecture.

The invention also needs to work with SDRAM memory and leverage burst reading where possible. The data storage spatial requirements must be reasonable which may be considered to be 32 bytes or less per prefix stored. The storage should also be scaleable for different numbers of stored prefixes without degradation of performance with larger tables.

It should be understood by those skilled in the art that modifications may be made without departing from the scope of the invention. Accordingly, reference should be made to the accompanying claims, rather than the foregoing specification, to determine the scope of the invention.

What is claimed is:

1. A method for storing and accessing data in a content addressable memory, the method comprising:
   creating a prefix table including at least one significant node having a prefix, a significance value, and associated data, the prefix table further including at least one transition node having a transition node significance value with at least one arc indicating a node having a higher significance value than the transition node significance value;
   obtaining a seek prefix indicative of data to be retrieved from the content addressable memory;
   searching said prefix table for nodes having a prefix matching at least a portion of the seek prefix;
   determining a node having the highest number of bits matching at least a portion of the seek prefix; and
   returning the associated data corresponding to the node having the highest number of bits matching at least a portion of the seek prefix.

2. The method of claim 1 wherein said nodes include:
   at least one primary node having a predefined significance value and including an arc having an arc range; and
   a secondary node having significance value based on said predefined significance value and said arc range, said arc pointing from said primary node to said secondary node.

3. The method of claim 2 wherein:
   said at least one primary node includes a first primary node having a first significance value and a second primary node having a second significance value, said first significance value and said second significance value differing by an amount based on a maximum arc range.

4. The method of claim 2 wherein said searching comprises:
   locating a first primary node having a first predefined significance value and a prefix matching at least a portion of the seek prefix;
   wherein if said locating locates the first primary node having a prefix matching at least a portion of the seek prefix, then searching all secondary nodes from said first primary node to locate a prefix matching at least a portion of the seek prefix.

5. The method of claim 4 wherein:
   said searching all secondary nodes from said first primary node occurs simultaneously for all said secondary nodes from said first primary node.

6. The method of claim 4 wherein:
   if said locating fails to locate the first primary node having a prefix matching at least a portion of the seek prefix, then examining a second primary node having a second predefined significance value to locate a prefix matching at least a portion of the seek prefix.

7. The method of claim 6 wherein:
   if said examining the second primary node locates a prefix matching at least a portion of the seek prefix, then searching all secondary nodes from said second primary node to locate a prefix matching at least a portion of the seek prefix.

8. A method for storing and accessing data in a content addressable memory, the method comprising:
   searching a prefix table for nodes having a prefix matching at least a portion of a seek prefix indicative of data to be retrieved from the content addressable memory, the prefix table having at least:
   a significant node including a prefix, a significant value and associated data, and
   a transition node including a transition node significance value with at least one arc indicating a node having a higher significance value than the transition node significance value;
   determining a node having the highest number of bits matching at least a portion of the seek prefix; and
   returning the associated data corresponding to the node having the highest number of bits matching at least a portion of the seek prefix.

9. The method of claim 8 wherein said nodes include:
   at least one primary node having a predefined significance value and including an arc having an arc range; and
   a secondary node having significance value based on said predefined significance value and said arc range, said arc pointing from said primary node to said secondary node.

10. The method of claim 9 wherein:
    said at least one primary node includes a first primary node having a first significance value and a second primary node having a second significance value, said first significance value and said second significance value differing by an amount based on a maximum arc range.

11. The method of claim 9 wherein said searching comprises:
    locating a first primary node having a first predefined significance value and a prefix matching at least a portion of the seek prefix;
    wherein if said locating locates the first primary node having a prefix matching at least a portion of the seek prefix, then searching all secondary nodes from said first primary node to locate a prefix matching at least a portion of the seek prefix.

12. The method of claim 11 wherein:

said searching all secondary nodes from said first primary node occurs simultaneously for all said secondary nodes from said first primary node.

13. The method of claim 11 wherein:

if said locating fails to locate the first primary node having a prefix matching at least a portion of the seek prefix, then examining a second primary node having a second predefined significance value to locate a prefix matching at least a portion of the seek prefix.

14. The method of claim 13 wherein:

if said examining the second primary node locates a prefix matching at least a portion of the seek prefix, then searching all second nodes from said second primary node to locate a prefix matching at least a portion of the seek prefix.

* * * * *